United States Patent
Kim (10) Patent No.: US 10,644,722 B2
(45) Date of Patent: May 5, 2020

(54) SERIALIZER AND SEMICONDUCTOR SYSTEM INCLUDING THE SAME

(71) Applicant: SK hynix Inc., Gyeonggi-do (KR)

(72) Inventor: Young-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 82 days.

(21) Appl. No.: 16/056,926

(22) Filed: Aug. 7, 2018

(65) Prior Publication Data

US 2019/0238156 A1 Aug. 1, 2019

(30) Foreign Application Priority Data

Feb. 1, 2018 (KR) .................... 10-2018-0012745

(51) Int. Cl.
| | | |
|---|---|---|
| H04Q 11/04 | (2006.01) | |
| H03M 9/00 | (2006.01) | |
| H03K 3/037 | (2006.01) | |
| H03K 19/0185 | (2006.01) | |
| H03K 3/356 | (2006.01) | |

(52) U.S. Cl.
CPC .............. *H03M 9/00* (2013.01); *H03K 3/037* (2013.01); *H03K 19/018521* (2013.01); *H04Q 11/0421* (2013.01); *H03K 3/356095* (2013.01); *H04Q 2213/036* (2013.01)

(58) Field of Classification Search
None
See application file for complete search history.

(56) References Cited

U.S. PATENT DOCUMENTS

| | | | | |
|---|---|---|---|---|
| 6,107,946 A | * | 8/2000 | Jeong | H03K 19/018592 341/101 |
| 6,278,312 B1 | | 8/2001 | Dabral et al. | |
| 2006/0044891 A1 | | 3/2006 | Lin et al. | |
| 2008/0309375 A1 | * | 12/2008 | Schnarr | G01R 31/31727 327/2 |
| 2015/0123826 A1 | * | 5/2015 | Lee | H03M 9/00 341/101 |
| 2015/0229298 A1 | * | 8/2015 | Tomita | H03L 7/07 375/376 |
| 2015/0229327 A1 | | 8/2015 | Nedovic | |
| 2016/0380638 A1 | * | 12/2016 | Kumazawa | H03L 7/0807 375/354 |
| 2019/0253041 A1 | * | 8/2019 | Kim | G11C 7/103 375/354 |

FOREIGN PATENT DOCUMENTS

KR 1020150052633 5/2015

* cited by examiner

*Primary Examiner* — Anh Vu H Ly
(74) *Attorney, Agent, or Firm* — IP & T Group LLP (57) ABSTRACT

A serializer includes: a data trigger circuit suitable for latching a plurality of input data based on a plurality of clocks having a predetermined phase difference to output a plurality of aligned data and a plurality of complementary aligned data; a hybrid multiplexing circuit suitable for outputting a pull-down signal and a pull-up signal that are selectively controlled based on a pull-down control signal which is generated by removing an input loading of the aligned data and a pull-up control signal which is generated by removing an input loading of the complementary aligned data; and an output driver suitable for outputting serial data corresponding to the pull-up signal and the pull-down signal.

20 Claims, 9 Drawing Sheets

SERIALIZER AND SEMICONDUCTOR SYSTEM INCLUDING THE SAME

CROSS-REFERENCE TO RELATED APPLICATIONS

The present application claims priority under 35 U.S.C. § 119(a) to Korean Patent Application No. 10-2018-0012745, filed on Feb. 1, 2018, which is incorporated herein by reference in its entirety.

BACKGROUND

1. Field

Exemplary embodiments of the invention relate to a semiconductor designing technology, and more particularly, to a semiconductor system including a hybrid-type serializer.

2. Description of the Related Art

Electronic devices include many electronic components. Among them, a semiconductor system may include many electronic components formed of semiconductor devices. The semiconductor devices constituting the semiconductor system may transfer data in synchronization with a clock to perform a serial communication. According to a type of serial communications, asynchronous clock data may be transmitted. When data is transferred via a serial communication in the semiconductor system, a semiconductor device may receive data that are serially entered from another semiconductor device and convert received data into parallel internal data, to speedily handle a large amount of data therein. In addition, the semiconductor device may convert the parallel internal data into serial data to output the serial data into another semiconductor device. In other words, at least one semiconductor device may include a serializer that converts a parallel data into a serial data to support a serial communication through a data bus.

The serializer generally has a structure for sequentially outputting a plurality of data in synchronization with an edge of a clock. Semiconductor systems or semiconductor devices have been developed to operate at high speed with low power consumption. As the operating speed of the system increases, the speed of the clock continues to increase. As the power consumption of systems becomes lower, the amplitude of the clock and data may decrease. Accordingly, is it is likely that the serializer is capable of accurately converting data even in a high-speed and low-voltage operational environment.

SUMMARY

Embodiments of the invention are directed to a hybrid-type serializer that combines a static logic, which is advantageous for a high-speed operation due to small loading of input signals, with a dynamic logic, which may maintain a pulse width of an output signal at a uniform level even when the pulse width of the input signals varies, as well as a semiconductor system including the hybrid-type serializer.

In accordance with an embodiment of the present invention, a serializer includes: a data trigger circuit suitable for latching a plurality of input data based on a plurality of clocks having a predetermined phase difference to output a plurality of aligned data and a plurality of complementary aligned data; a hybrid multiplexing circuit suitable for outputting a pull-down signal and a pull-up signal that are selectively driven based on a pull-down control signal which is generated by removing input loading of the aligned data and a pull-up control signal which is generated by removing input loading of the complementary aligned data; and an output driver suitable for outputting serial data corresponding to the pull-up signal and the pull-down signal.

In accordance with another embodiment of the present invention, a semiconductor system includes: a first semiconductor device; and a second semiconductor device suitable for serially communicating with the first semiconductor device through a transfer line, wherein each of the first semiconductor device and the second semiconductor device includes the transfer line for converting parallel internal data into a serial data, and the transfer line includes: a data trigger circuit suitable for latching the internal data based on a plurality of clocks having a predetermined phase difference to output a plurality of aligned data and a plurality of complementary aligned data; a hybrid multiplexing circuit suitable for outputting a pull-down signal and a pull-up signal that are selectively driven based on a pull-down control signal which is generated by removing input loading of the aligned data and a pull-up control signal which is generated by removing input loading of the complementary aligned data; and an output driver suitable for outputting the serial data corresponding to the pull-up signal and the pull-down signal.

In accordance with another embodiment of the present invention, a semiconductor system includes: A semiconductor system, comprising: plural semiconductor devices, each including a serializer and a deserializer, supporting a serial communication therebetween and a parallel signal processing therein, wherein the serializer includes: a data trigger circuit suitable for aligning parallelly processed data based on a predetermined phase difference determined by dividing an operation cycle by the number of parallelly processed data; a hybrid multiplexing circuit suitable for generating plural pairs of control signals, each pair based on each of aligned data delivered from the data trigger circuit, to remove an interference between the aligned data; and an output driver suitable for generating a serial data including plural values, each determined by each pair of control signals.

These and other features and advantages of the present invention will become apparent to those with ordinary skill in the art to which the present invention belongs from the following description in conjunction with the accompanying drawings.

DETAILED DESCRIPTION

Exemplary embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the invention.

It is to be understood that embodiments of the present invention are not limited to the particulars shown in the drawings, that the drawings are not necessarily to scale, and, in some instances, proportions may have been exaggerated to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, the term "and/or" includes any and all combinations of one or more of the associated listed items.

As used herein, singular forms are intended to include the plural forms as well, unless the context clearly indicates otherwise.

It will be further understood that the terms "includes," and "including" are used interchangeably in this specification with the open-ended terms "comprises," and "comprising," to specify the presence of any stated elements and to not preclude the presence or addition of one or more other non-stated elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Also, as used herein, the term "and/or" includes any and all combinations of one or more of the associated listed items.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, a serializer formed of a dynamic logic and a static logic will be described with reference to FIGS. 1A and 2B. In the invention, the static logic may be a circuit that may always output an output signal of a predefined logic level, e.g., a logic high level or a is logic low level, based on the logic level of an input signal, and the dynamic logic may be a circuit capable of outputting an output signal in a high-impedance state (high-Z) based on the logic level of the input signal.

Referring to FIGS. 1A to 2B, by the way of example but not limitation, a 4:1 serializer that receives four differential input data pairs BL0-BL0B, BL1-BL1B, BL2-BL2B, BL3-BL3B and outputs one differential serial data pair OUT-OUTS is described. Herein, the differential input data pairs BL0-BL0B, BL1-BL1B, BL2-BL2B, BL3-BL3B may be data generated by latching input data (not shown) according to a clock (not shown). The input data BL0 to BL3 and the complementary input data BL0B to BL3B may correspond to a signal in which an input data is differentially amplified and outputted in a sensing section and to a data that maintains a logic high level in a pre-charge section.

Figure 1A:
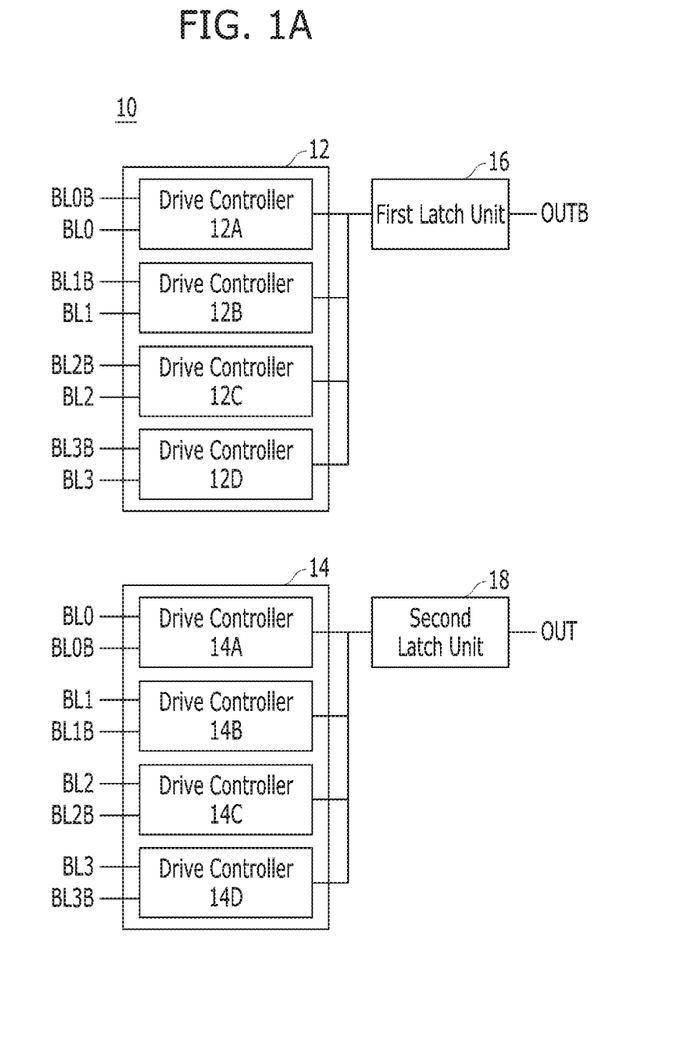
FIG. 1A is a block diagram illustrating a serializer formed of a dynamic logic.
Figure 1B:
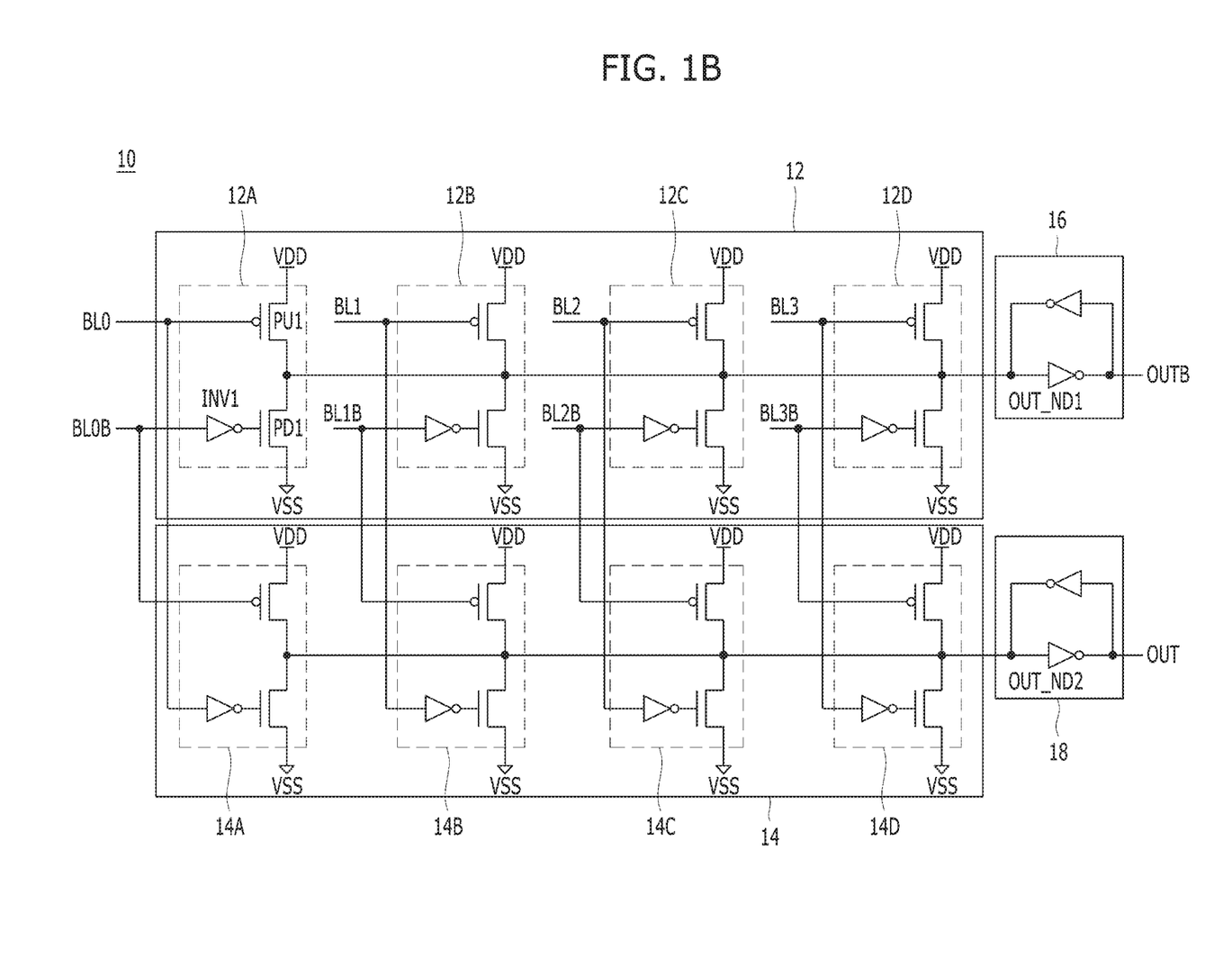
FIG. 1B is a circuit diagram of the serializer shown in FIG. 1A.
Figure 1C:
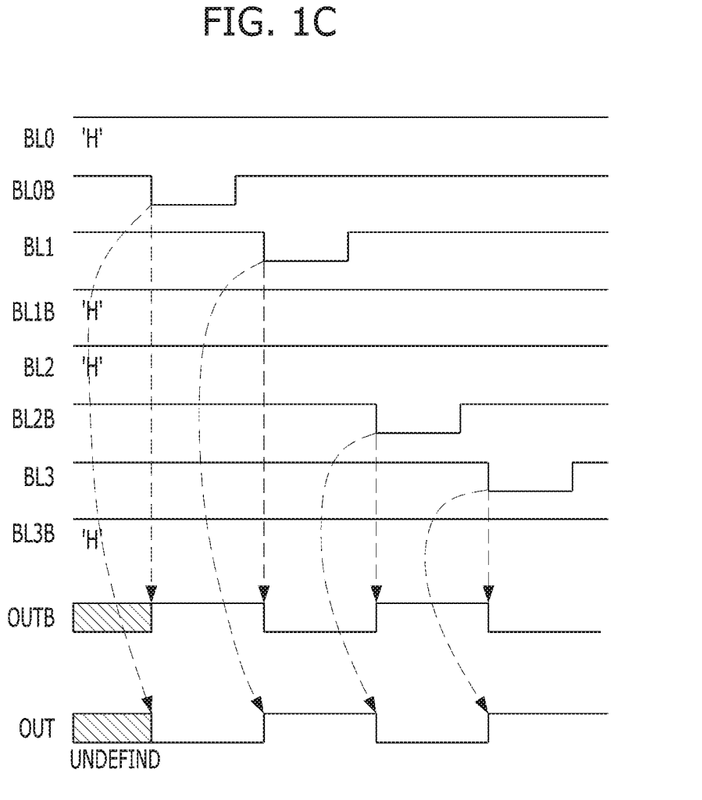
FIG. 1C is an operation waveform diagram of the serializer shown in FIG. 1A.

FIG. 1A is a block diagram illustrating a serializer 10 formed of a dynamic logic. FIG. 1B is a circuit diagram of the serializer 10 shown in FIG. 1A. FIG. 1C is an operation waveform diagram of the serializer 10 shown in FIG. 1A.

Referring to FIGS. 1A and 1B, the serializer 10 may include a first dynamic multiplexing (MUX) unit 12, a second dynamic multiplexing unit 14, a first latch unit 16, and a second latch unit 18.

The first dynamic multiplexing unit 12 may include a plurality of drive controllers 12A through 12D. Each of the drive controllers 12A to 12D may output a first drive control signal that is enabled or determined based on a corresponding differential input data among the differential input data pairs BL0-BL0B, BL1-BL1B, BL2-BL2B, BL3-BL3B. For example, the first drive controllers 12A may include a pull-up transistor PU1, an inverter INV1, and a pull-down transistor PD1. The pull-up transistor PU1 may be coupled between a power source voltage VDD terminal and a first output node OUT_ND1 to receive the input data BL0 through a gate. The pull-down transistor PD1 may be coupled between a ground voltage VSS terminal and the first output node OUT_ND1. The pull-down transistor PD1 may receive an inverted signal of the complementary input data BL0B which is inverted by the inverter INV1 through a gate. The first latch unit 16 may invert and latch the first drive control signal delivered from the first output node OUT_ND1 to output a serial data OUTB.

The second dynamic multiplexing unit 14 may include a plurality of drive controllers 14A to 14D. Each of the drive controllers 14A to 14D may output a second drive control signal that is enabled or determined based on the corresponding differential input data among the differential input data pairs BL0-BL0B, BL1-BL1B, BL2-BL2B, BL3-BL3B.

Since the drive controllers, 14A to 14D, of the second dynamic multiplexing unit 14 are the same as the drive controllers, 12A to 12D, of the first dynamic multiplexing unit 12 except that the data inputted to the pull-up transistor and the pull-down transistor of the drive controllers 14A to 14D are reversed compared to data inputted to the pull-up transistor and the pull-down transistor of the drive controllers 12A to 12D. Hence, detailed description of the drive controllers 14B to 14D will be omitted herein. The second latch unit 18 may invert and latch the second drive control signal outputted from a second output node OUT_ND2 to output a serial data OUT.

Herein, when there are no latch units 16 and 18 at the rear end and the input data BL0 to BL3 and the complementary input data BL0B to BL3 are all at a logic high level, the first dynamic multiplexing unit 12 and the second dynamic multiplexing unit 14 may output the first drive control signal and the second drive control signal of a high impedance (High-Z) state. However, having the latch units 16, 18 at the rear end can maintain the first drive control signal and the second drive control signal, outputs of the first dynamic mux portion 12 and the second dynamic mux portion 14, at the previous state, when the input data BL0 to BL3 and the complementary input data BL0B to BL3B are all at a logic high level.

Referring to FIG. 1C, when both the input data BL0 to BL3 and the complementary input data BL0B to BL3B are at a logic high level, the serial data OUTB, OUT may maintain the previous state. In an initial time section where the previous state is not defined, the serial data OUTB and OUT has an undefined state. When any one between the input data BL0 to BL3 is at a logic low level, the serial data OUTB may transition into a logic low level and the serial data OUT may transition into a logic high level. Also, when any one between the complementary input data BL0B to BL3B is at a logic low level, the serial data OUTB may transition to a logic high level and the serial data OUT may transition to a logic low level.

As described above, even though the pulse widths of the differential input data pairs BL0-BL0B, BL1-BL1B, BL2-BL2B, BL3-BL3B change, the serializer 10 including the dynamic logic may determine the pulse width of the serial data pair OUT-OUTB at a uniform level as long as the differential input data pairs BL0-BL0B, BL1-BL1B, BL2-BL2B, BL3-BL3B do not overlap with each other in a time domain. However, the serializer 10 may be limited in a high-speed operation in terms of its performance because of the operational margin or burden for loading the input signals coupled to an input terminal of the first latch unit 16, i.e., the first output node OUT_ND1, and loading the input signals coupled to an input terminal of the second latch unit 18, i.e., the second output node OUT_ND2.

Figure 2A:
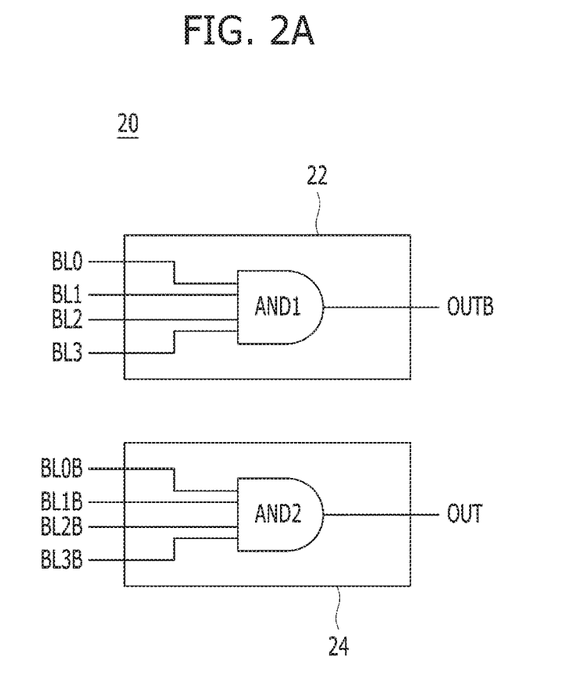
FIG. 2A is a block diagram illustrating a serializer formed of a static logic.

FIG. 2A is a block diagram illustrating a serializer 20 formed of a static logic. FIG. 2B is an operation waveform diagram of the serializer 20 shown in FIG. 2A.

Referring to FIG. 2A, the serializer 20 may include a first static multiplexing unit 22 and a second static multiplexing unit 24. The first static multiplexing unit 22 may include an AND gate AND1 for receiving input data BL0 to BL3, and a second static multiplexing unit 24 may include an AND gate AND2 for receiving complementary input data BL0B to BL3B.

Figure 2B:
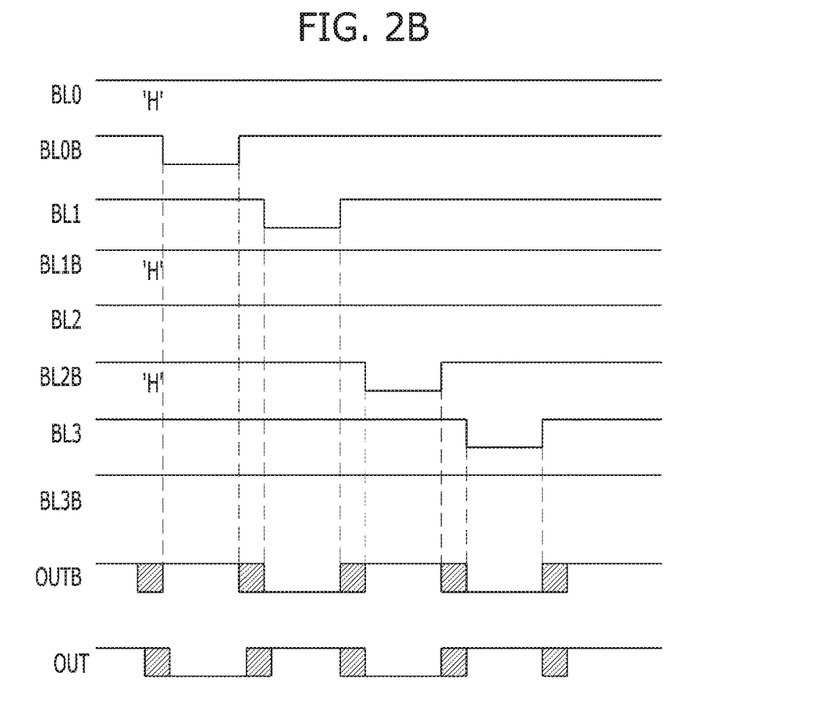
FIG. 2B is an operation waveform diagram of the serializer shown in FIG. 2A.

Referring to FIG. 2B, when the input data BL0 to BL3 and the complementary input data BL0B to BL3B are all at a logic high level, the serial data OUTB, OUT are at a logic high level. When any one between the input data BL0 to BL3 is at a logic low level, the serial data OUTB may transition to a logic low level. Also, when any one between the complementary input data BL0B to BL3B is at a logic low level, the serial data OUT may transition to a logic low level.

As described above, the serializer 20 including the static logic may have an advantage in that it may perform a high-speed operation due to small loading on the input terminal. However, when the pulse widths of the input data BL0 to BL3 and BL0B to BL3B are changed as illustrated in the shaded portion of FIG. 1C, the pulse width of the serial data OUTB, OUT may be changed accordingly. Therefore, in order to operate the serializer 20 including the static logic, it is necessary to precisely adjust the pulse widths of the input data BL0 to BL3 and BL0B to BL3B so that there is no undefined section when the input data transition. However, since the pulse widths of the input data BL0 to BL3 and BL0B to BL3B are changed together due to a change of the duty and the delay amount of the clock due to a change in PVT, it is very difficult to design the serializer 20.

Hereinafter, a hybrid-type serializer in which a static logic and a dynamic logic are combined with each other will be described in accordance with an embodiment of the invention.

Figure 3:
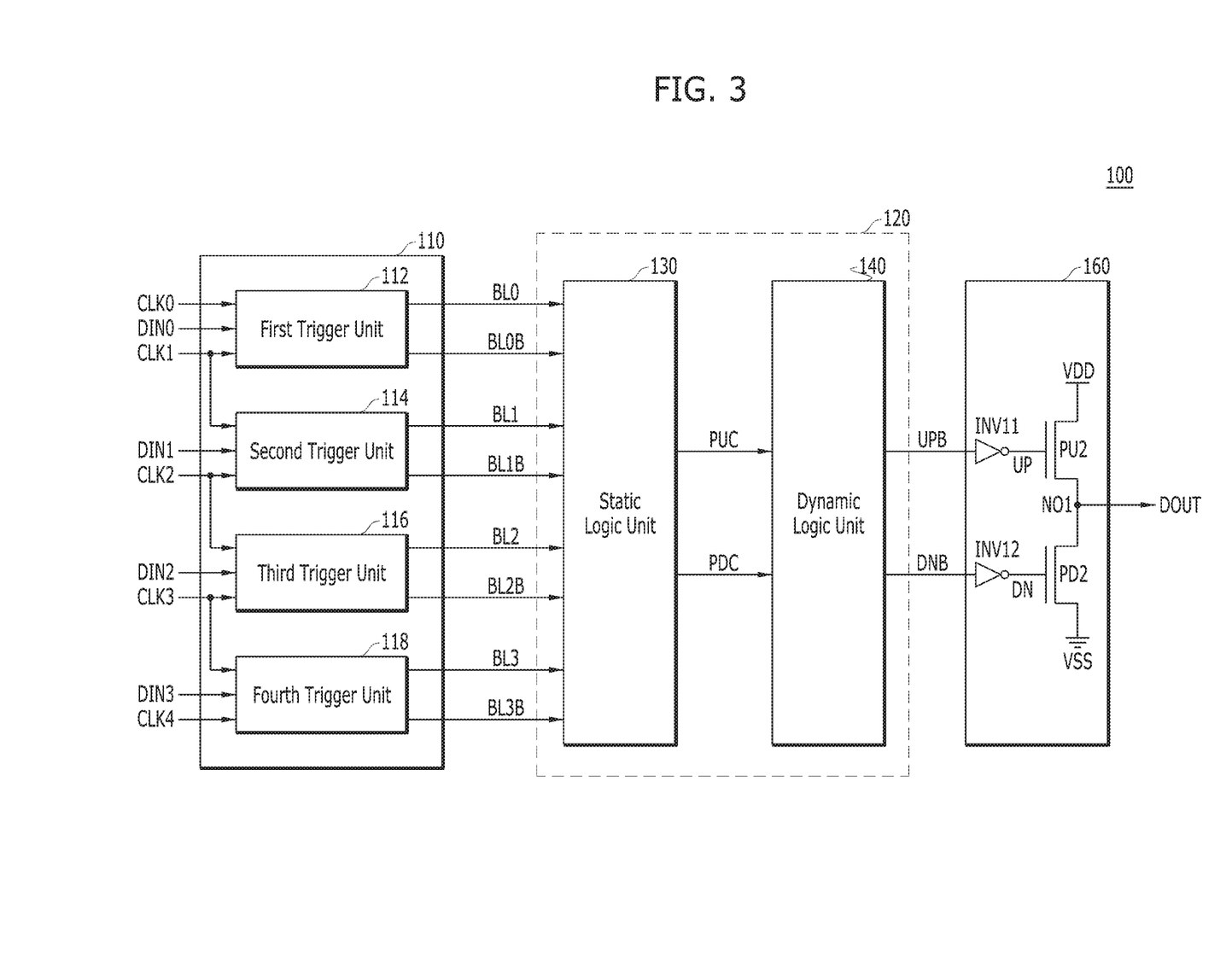
FIG. 3 is a block diagram illustrating a serializer in accordance with an embodiment of the invention.

FIG. 3 is a block diagram illustrating a serializer 100 in accordance with an embodiment of the invention.

Referring to FIG. 3, the serializer 100 may include a data trigger circuit 110, a hybrid multiplexing circuit 120, and an output driver 160. In FIG. 3, by the way of example but not limitation, a 4:1 serializer 100 that receives four input data DIN0 to DIN3 and outputs one serial data DOUT is described.

The data trigger circuit 110 may latch the first to fourth input data DIN0 to DIN3 according to a plurality of clocks CLK0 to CLK4 having a predetermined phase difference to output first to fourth aligned data BL0 to BL3 and first to fourth complementary aligned data BL0B to BL3B. Herein, the predetermined phase difference may be set to a phase difference obtained by dividing 360 degrees(°) by the number of input data. For example, since the number of the first to fourth input data DIN0 to DIN3 is four, the phase interval may be set according to four clocks having a phase difference of 90 degrees(°), i.e., a quarter of clock cycle. In FIG. 3, the first to fifth clock signals CLK0 to CLK4 are shown, and the fifth clock signal CLK4 may have substantially the same waveform as the first clock signal CLK0 but may be a clock whose phase is delayed by 360 degrees(°).

The data trigger circuit 110 may differentially amplify the first to fourth input data DIN0 to DIN3 according to adjacent clocks among the first to fifth clocks CLK0 to CLK4 to output first to fourth aligned data BL0 to BL3 and first to fourth complementary aligned data BL0B to BL3B, respectively. The data trigger circuit 110 may differentially amplify the first to fourth input data DIN0 to DIN3 in an I section where adjacent clocks among the first to fifth clocks CLK0 to CLK4 have a predetermined logic level, for example, e.g., a logic high level, to output the first to fourth aligned data BL0 to BL3 and the first to fourth complementary aligned data BL0B to BL3B. The data trigger circuit 110 may pre-charge the first to fourth aligned data BL0 to BL3 and the first to fourth complementary aligned data BL0B to BL3B to a logic high level in a second section which is not the first section, that is, a section where at least one of the adjacent clocks has a logic low level.

The data trigger circuit 110 may include first to fourth trigger units 112 to 118 that correspond to the first to fourth input data DIN0 to DIN3, respectively. The first trigger unit 112 may differentially amplify the first input data DIN0 according to the first clock CLK0 and the second clock CLK1 to output first aligned data BL0 and first complementary aligned data BL0B. The second trigger unit 114 may differentially amplify the second input data DIN1 according to the second clock CLK1 and the third clock CLK2 to output the second aligned data BL1 and the second complementary aligned data BL1B. The third trigger unit 116 may differentially amplify the third input data DIN2 according to the third clock CLK2 and the fourth clock CLK3 and output the third aligned data BL2 and the third complementary aligned data BL2B. The fourth trigger unit 118 may differentially amplify the fourth input data DIN3 according to the fourth clock CLK3 and the fifth clock CLK4 and output the fourth aligned data BL3 and the fourth complementary aligned data BL3B.

The hybrid multiplexing circuit 120 may output a pull-down signal DNB and a pull-up signal UPB which are selectively determined or controlled based on a pull-down control signal PDC and a pull-up control signal PUC. The pull-down control signal PDC may be generated by removing/minimizing an input loading of first to fourth aligned data BL0 to BL3. The pull-up control signal PUC may be generated by removing/minimizing an input loading of the first to fourth complementary aligned data BL0B to BL3B. For reference, the "input loading" may mean the total amount loaded when sending signals to an input device. That is, the input loading of the first to fourth aligned data BL0 to BL3 may mean the total amount loaded when sending the first to fourth aligned data BL0 to BL3 to the hybrid multiplexing circuit 120. The input loading of the first to fourth complementary aligned data BL0B to BL3B may mean the total amount loaded when sending the first to fourth complementary aligned data BL0B to BL3B to the hybrid multiplexing circuit 120.

The hybrid multiplexing circuit 120 may include a static logic unit 130 and a dynamic logic unit 140.

The static logic unit 130 may generate the pull-down control signal PDC by removing the input loading of the first to fourth aligned data BL0 to BL3. The static logic unit 130 may generate the pull-up control signal PUC by removing the input loading of the first to fourth complementary aligned data BL0B to BL3B. In the proposed embodiment of the invention, the static logic unit 130 may output the pull-down control signal PDC at a logic high level when the first to fourth aligned data BL0 to BL3 are all at a logic high level, while outputting the pull-up control signal PUC at a logic high level when the first to fourth complementary aligned data BL0B to BL3B are all at a logic high level. In other words, the static logic unit 130 may output the pull-down control signal PDC at a logic low level when any one among the first to fourth aligned data BL0 to BL3 is at a logic low level. Also, the static logic unit 130 may output the pull-up control signal PUC at a logic low level when any one among the first to fourth complementary aligned data BL0B to BL3B is at a logic low level.

The dynamic logic unit 140 may output the pull-down signal DNB and the pull-up signal UPB which are selectively driven according to the pull-down control signal PDC and the pull-up control signal PUC. The dynamic logic unit 140 may determine that the pull-down signal DNB is a logic high level. The dynamic logic unit 140 may make the pull-up signal UPB be a logic low level when the pull-down control signal PDC is at a logic high level and the pull-up control signal PUC is at a logic low level. Conversely, the dynamic logic unit 140 may control the pull-down signal DNB to have a logic high level and make the pull-up signal UPB be a logic low level when the pull-down control signal PDC is at a logic low level and the pull-up control signal PUC is at a logic high level. The dynamic logic unit 140 may keep the pull-down signal DNB and the pull-up signal UPB in a previous state when both the pull-down control signal PDC and the pull-up control signal PUC have a logic high level.

The output driver 160 may output the serial data DOUT corresponding to the pull-down signal DNB and the pull-up signal UPB. The output driver 160 may include a first inverter INV11, a second inverter INV12, a pull-up transistor PU2, and a pull-down transistor PD2. The first inverter INV11 may invert the pull-up signal UPB, while the second inverter INV12 may invert the pull-down signal DNB. The pull-up transistor PU2 may be coupled in series between a power source voltage VDD terminal and an output terminal NO1. The pull-up transistor PU2 may receive the output signal UP of the first inverter INV11 through a gate. The pull-down transistor PD2 may be coupled in series between a ground voltage VSS terminal and the output terminal NO1. The pull-down transistor PD2 may receive an output signal DN of the second inverter INV12 through a gate. The pull-up transistor PU2 and the pull-down transistor PD2 may be formed of NMOS transistors. Therefore, the output driver 160 may output the serial data DOUT of a logic high level when the pull-up signal UPB is at a logic low level to output the serial data DOUT of a logic low level when the pull-down signal DNB is at a logic low level.

As described above, the serializer 100 may output one serial data DOUT corresponding to the first to fourth input data DIN0 to DIN3. Herein, the hybrid-type serializer 100 in accordance with the embodiment of the invention may be implemented with a hybrid-type serializer that combines a static logic which is advantageous for a high-speed operation due to a small loading of input signals and a dynamic logic which may constantly maintain a pulse width of an output signal even though the pulse width of the input signals varies. The hybrid-type serializer may be able to perform a high-speed operation and improve operational reliability.

Hereinafter, the detailed structure of each constituent element of the serializer 100 shown in FIG. 3 will be described with reference to the accompanying drawings.

Figure 4:
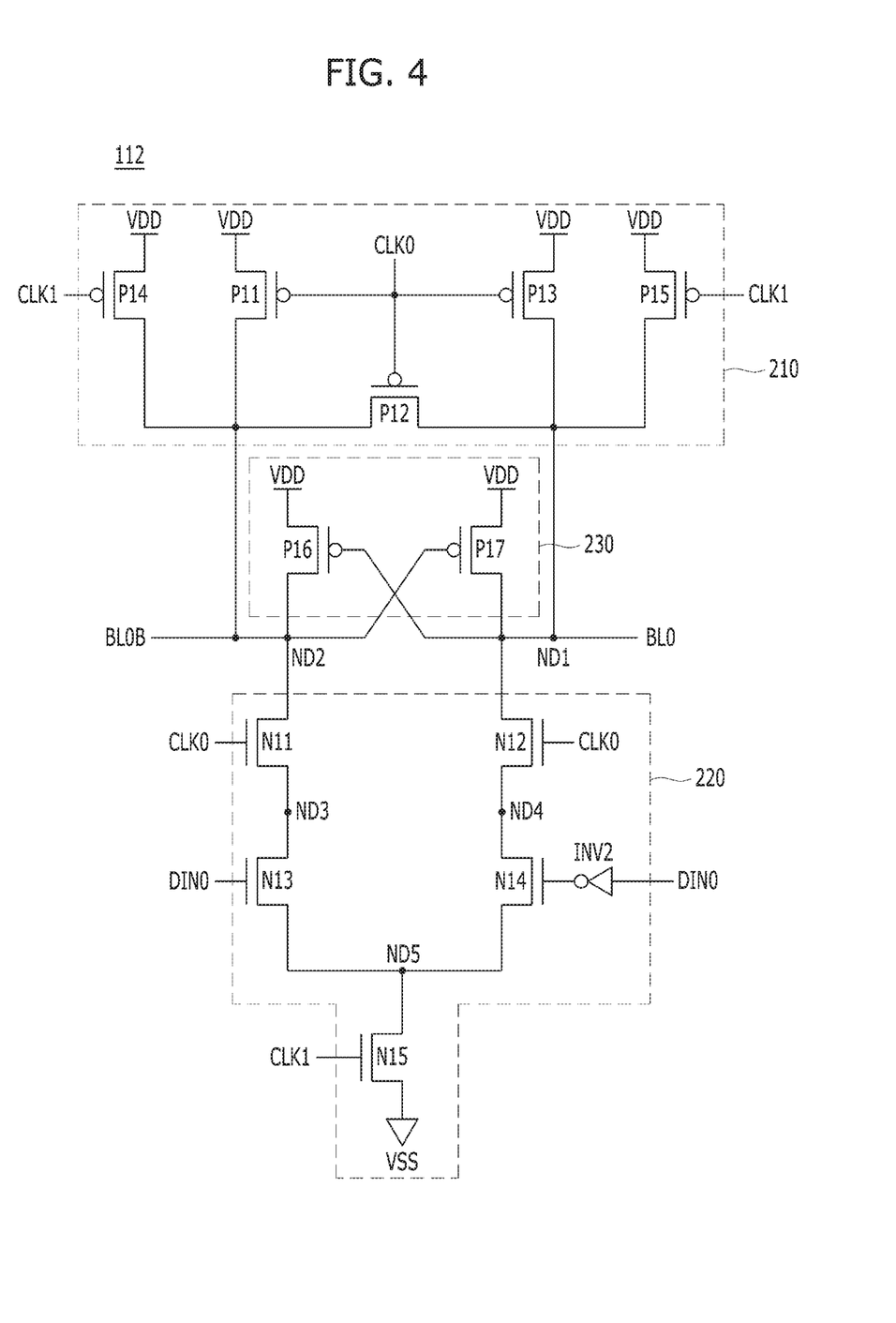
FIG. 4 is a circuit diagram of a first trigger unit illustrated in FIG. 3.

FIG. 4 is a circuit diagram of the first trigger unit 112 illustrated in FIG. 3. Since the first to fourth trigger units 112 to 118 may have substantially the same structure, the first trigger unit 112 will be described as a representative example.

Referring to FIG. 4, the first trigger unit 112 may include an initializer 210, a charge discharger 220, and a charge supplier 230.

The initializer 210 may include first to fifth PMOS transistors P11 to P15. The first to third PMOS transistors P11 to P13 may initialize a first node ND1 that outputs the first aligned data BL0 and a second node ND2 that outputs the first complementary aligned data BL0B to a logic high level in a section where the first clock CLK0 is at a logic low level. The third and fourth PMOS transistors P14 and P15 may initialize the first node ND1 and the second node ND2 to a logic high level in a section where the second clock CLK1 is at a logic low level.

The charge discharger 220 may include first to fifth NMOS transistors N11 to N15. The first NMOS transistor N11 may be coupled between the second node ND2 and the third node ND3 to be turned on in response to the first clock CLK0. The second NMOS transistor N12 may be coupled between the first node ND1 and the fourth node ND4 to be turned on in response to the first clock CLK0. The third NMOS transistor N13 may be coupled between the third node ND3 and the fifth node ND5 to be turned on in response to the first input data DIN0. The fourth NMOS transistor N14 may be coupled between the fourth node ND4 and the fifth node ND5 to be turned on in response to the output of the inverter INV2 which inverts the first input data DIN0 and outputs the inverted first input data. The fifth NMOS transistor N15 may be turned on in response to the second clock CLK1 to discharge the charge of the node ND5. The charge discharger 220 may discharge the charges of the first and second nodes ND1, ND2 based on the logic level of the first input data DIN0 in a section where the first clock CLK0 and the second clock CLK1 are at a logic high level. The charge discharger 220 may set the logic levels of the first and second nodes ND1, ND2. For example, when the first input data DIN0 of a logic high level is inputted, more charges are discharged from the second node ND2 than from the first node ND1, the charge discharger 220 may set the second node ND2 to a logic low level and set the first node ND1 to a logic high level.

The charge supplier 230 may include sixth and seventh PMOS transistors P16 and P17 that are selectively turned on based on the logic levels of the first and second nodes ND1, ND2, to selectively determine or control the first and second nodes ND1, ND2. When the first input data DIN0 of a logic high level is inputted and the second node ND2 is at a logic low level and the first node ND1 is set to a logic high level, the seventh PMOS transistor P17 which is turned on may supply electric charges to the first node ND1 so that the charge supplier 230 may amplify the voltage of the first node ND1. When the first input data DIN0 of a logic low level is inputted and the second node ND2 is at a logic high level and the first node ND1 is set to a logic low level, the sixth PMOS transistor P16 which is turned on may supply electric charges to the second node ND2 so that the charge supplier 230 may amplify the voltage of the second node ND2.

With the above-described structure, the first trigger unit 112 may differentially amplify the first input data DIN0 in a first section where the first clock CLK0 and the second clock CLK1 are at a logic high level to output the first aligned data BL0 and the first complementary aligned data BL0B. The first trigger unit 112 may pre-charge the first aligned data BL0 and the first complementary aligned data BL0B to a logic high level in a second section which is not the first section, which is a section where at least one between the first clock CLK0 and the second clock CLK1 has a logic low level.

Figure 5:
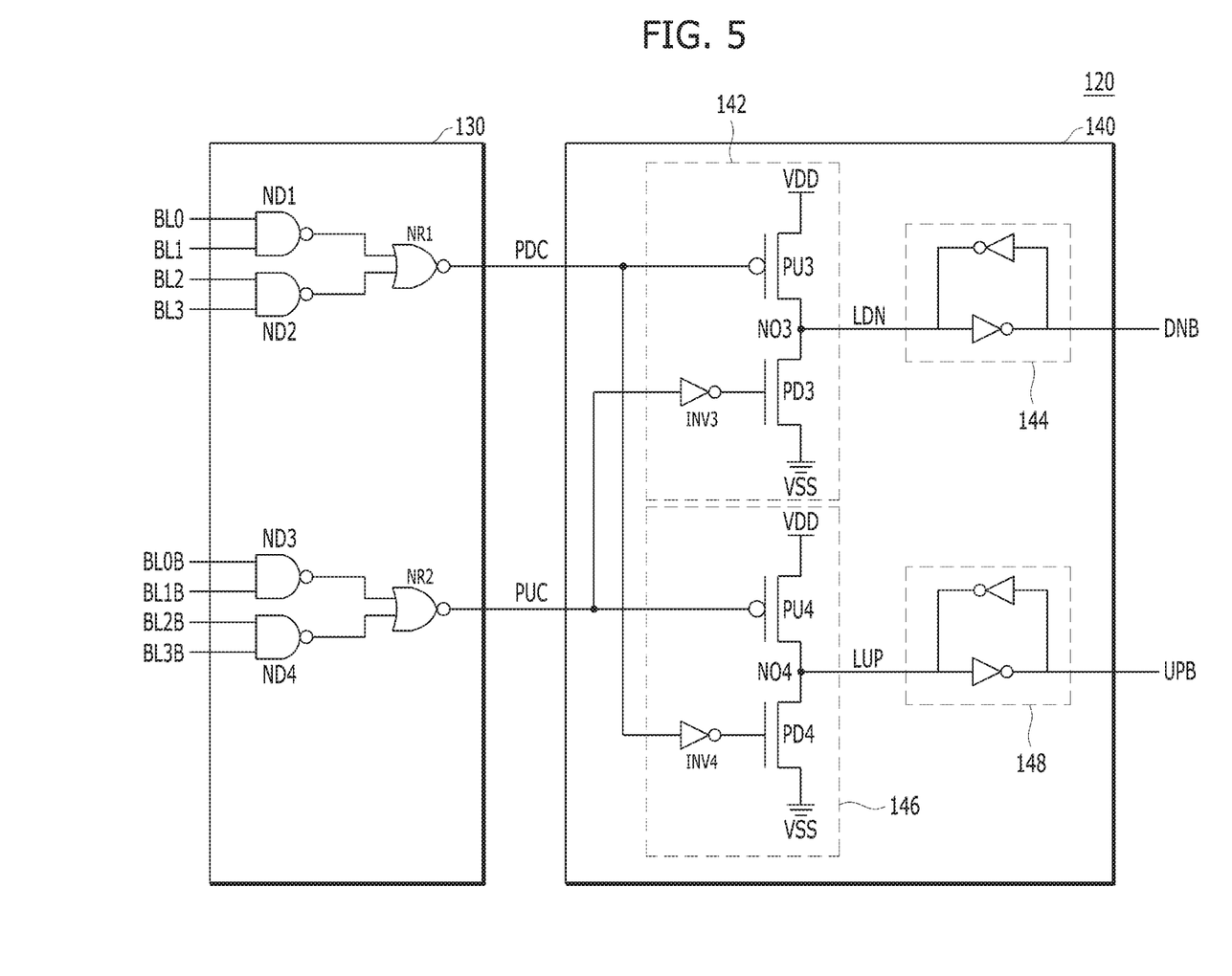
FIG. 5 is a circuit diagram of a static logic unit and a dynamic logic unit illustrated in FIG. 3.

FIG. 5 is a circuit diagram of the static logic unit 130 and a dynamic logic unit 140 illustrated in FIG. 3.

Referring to FIG. 5, the static logic unit 130 may include a plurality of first logic gates ND1, ND2, a second logic gate NR1, a plurality of third logic gates ND3, ND4, and a fourth logic gate NR2.

The first logic gates ND1, ND2 may perform a logic NAND operation onto two adjacent data among the first to fourth aligned data BL0 to BL3. For example, the first logic gate ND1 may perform a logic NAND operation onto the first aligned data BL0 and the second aligned data BL1, and the first logic gate ND2 may perform may perform a logic NAND operation onto the third aligned data BL2 and the fourth aligned data BL3. Each of the first logic gates ND1 and ND2 may be realized with a NAND gate. The second logic gate NR1 may perform a logic NOR operation onto the outputs of the first logic gates ND1, ND2 so as to output the pull-down control signal PDC.

The third logic gates ND3, ND4 may perform a logic NAND operation onto two adjacent data among the first to fourth complementary aligned data BL0B to BL3B. For example, the third logic gate ND3 may perform a logic NAND operation onto the first complementary aligned data BL0B and the second complementary aligned data BL1B, and the third logic gate ND4 may perform a logic NAND operation onto the third complementary aligned data BL2B and the fourth complementary aligned data BL3B. Each of the third logic gates ND3, ND4 may be realized with a NAND gate. The fourth logic gate NR2 may perform a logic NOR operation onto the outputs of the third logic gates ND3, ND4 so as to output the pull-up control signal PUC. Meanwhile, the logic gates of the static logic unit 130 shown in FIG. 5 may be only one example, but the invention is not limited thereto.

The dynamic logic unit 140 may include a first drive controller 142, a first latch 144, a second drive controller 146, and a second latch 148.

The first drive controller 142 may drive the first output signal LDN based on the pull-down control signal PDC and the pull-up control signal PUC. The first drive controller 142 may include a first pull-up transistor PU3, a first inverter INV3, and a first pull-down transistor PD3. The first pull-up transistor PU3 may be coupled between the power source voltage VDD terminal and the first output node NO3 that outputs the first output signal LDN. The first pull-up transistor PU3 may receive the pull-down control signal PDC through a gate. The first pull-down transistor PD3 may be coupled between the ground voltage VSS terminal and the first output node NO3. The first pull-down transistor PD3 may receive an inverted signal of the pull-up control signal PUC inverted in the first inverter INV3 through a gate. The first latch 144 may invert and latch the first output signal LDN outputted from the first output node NO3 to output the pull-down signal DNB.

The second drive controller 146 may drive the second output signal LUP according to the pull-down control signal PDC and the pull-up control signal PUC. The second drive controller 146 may include a second pull-up transistor PU4, a second inverter INV4, and a second pull-down transistor PD4. The second pull-up transistor PU4 may be coupled between the power source voltage VDD terminal and the second output node NO4 that outputs the second output signal LUP. The second pull-up transistor PU4 may receive the pull-up control signal PUC through a gate. The second pull-down transistor PD4 may be coupled between the ground voltage VSS terminal and the second output node N04. The second pull-down transistor PD4 may receive an inverted signal of the pull-down control signal PDC inverted in the second inverter INV4. The second latch 148 may invert and latch the second output signal LUP outputted from the second output node N04 and output the pull-up signal UPB.

Herein, when the first latch 144 and the second latch 148 do not exist and the pull-down control signal PDC and the pull-up control signal PUC are all at a logic high level, the second drive controller 146 may output the first output signal LDN and the second output signal LUP of a high-impedance state (high-Z).

However, due to the presence of the first latch 144 and the second latch 148 at the rear end, the first drive controller 142 and the second drive controller 146 may maintain the first output signal LDN and the second output signal LUP in a previous state when the pull-down control signal PDC and the pull-up control signal PUC are all at a logic high level.

As described above, the static logic unit 130 may output an output signal of a predefined logic level, for example, a logic high level or a logic low level, according to the logic level of the input signal. The static logic unit 130 may be advantageous for a high-speed operation as the loading of input signals are removed. Conversely, the dynamic logic unit 140 may maintain the pulse width of an output signal at a constant level, even though the pulse width of the input signals varies. Therefore, the invention may improve the operation reliability while capable of performing a high-speed operation through the hybrid-type serializer that combines the static logic and the dynamic logic.

The serializer 10 of FIG. 1B may include eight drive control units 12A to 12D and 14A to 14D for receiving four differential input data pairs BL0 to BL0B, BL1 to BL1B, BL2 to BL2B, BL3 to BL3B. In the serializer 100 in accordance with the embodiment of the invention, the static logic unit 130 may merge a plurality of aligned data BL0 to BL3, BL0B to BL3B. The dynamic logic unit 140 may be provided with a least number of drive control units 142, 146 for receiving the merged data. In other words, the serializer 100 in accordance with the embodiment of the invention may reduce the area and current consumption by sharing the drive control units 142, 146 for receiving the aligned data BL0 to BL3, BL0B to BL3B.

Figure 6:
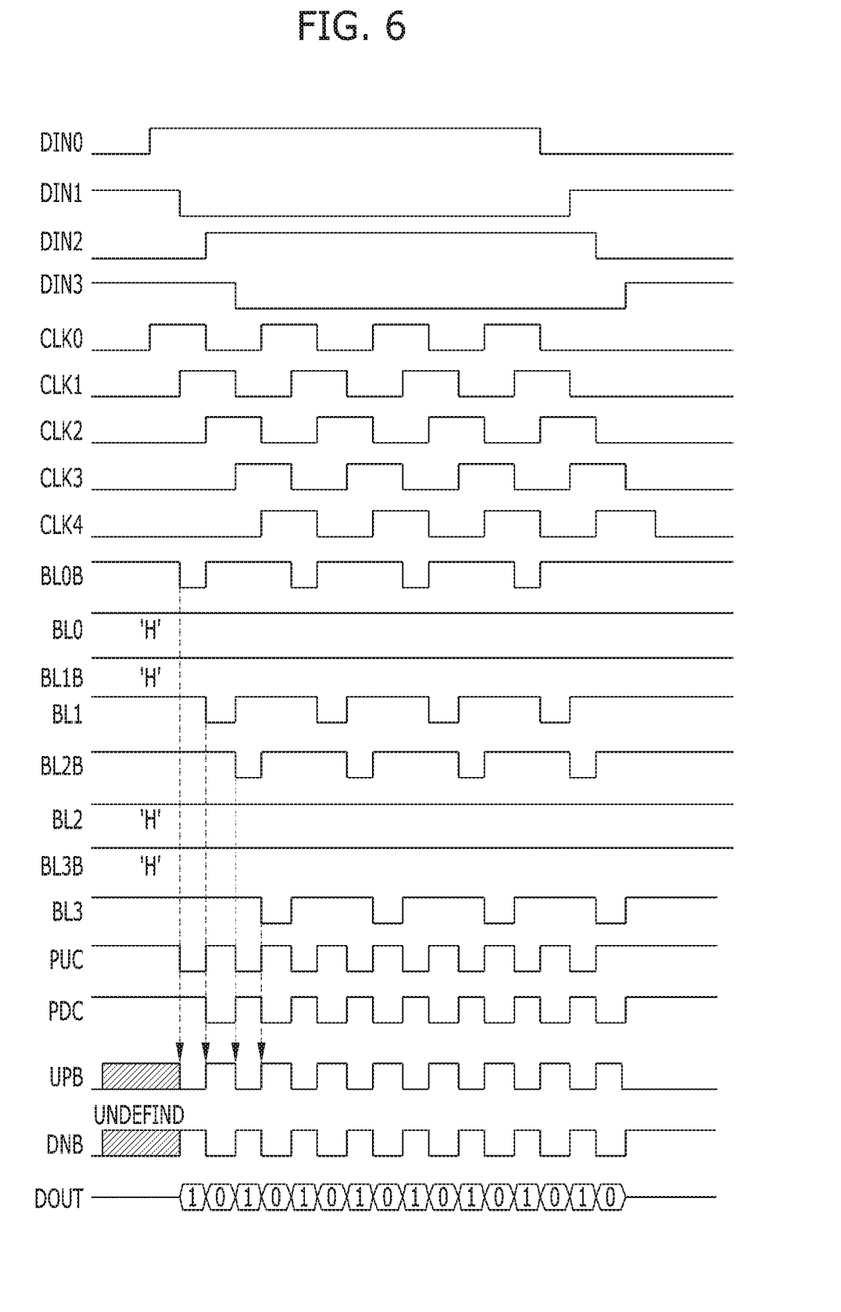
FIG. 6 is an operation waveform diagram of the serializer shown in FIG. 3.

FIG. 6 is an operation waveform diagram of the serializer 100 shown in FIG. 3.

Referring to FIG. 6, the first trigger unit 112 may differentially amplify the first input data DIN0 in a first section where the first clock CLK0 and the second clock CLK1 are at a logic high level, to output the first aligned data BL0 and the first complementary aligned data BL0B. The first trigger unit 112 may pre-charge the first aligned data BL0 and the first complementary aligned data BL0B to a logic high level in a second section which is not the first period. Therefore, based on the first input data DIN0 having a logic high level, the first trigger unit 112 may output the first aligned data BL0 that maintains a logic high level and the first complementary aligned data BL0B that toggles to a logic low level in the first section and maintains a logic high level in the second period.

Likewise, based on the second input data DIN1 having a logic low level, the second trigger unit 114 may output the second aligned data BL1 that toggles to a logic low level in the first section and maintains a logic high level in the second period and the second complementary aligned data BL1B that maintains a logic high level. Also, based on the third input data DIN2 having a logic high level, the third trigger unit 116 may output the third aligned data BL2 that maintains a logic high level and the third complementary aligned data BL2B that toggles to a logic low level in the first section and maintains a logic high level in the second period. Based on the fourth input data DIN5 having a logic low level, the fourth trigger unit 118 may output the fourth aligned data BL3 that toggles to a logic low level in the first section and maintains a logic high level in the second period, while outputting the fourth complementary aligned data BL3B that maintains a logic high level.

The static logic unit 130 may output the pull-down control signal PDC at a logic high level when all of the first to fourth aligned data BL0 to BL3 are at a logic high level. The static logic unit 130 may output the pull-up control signal PUC at a logic high level when first to fourth complementary aligned data BL0B to BL3B are at a logic high level. The static logic unit 130 may output the pull-down control signal PDC to a logic low level when any one among the first to fourth aligned data BL0 to BL3 is at a logic low level. The static logic unit 130 may output the pull-up control signal PUC to a logic low level when any one among the first to fourth complementary aligned data BL0B to BL3B is at a logic low level.

The dynamic logic unit 140 may maintain the pull-down signal DNB and the pull-up signal UPB in the previous state when both the pull-down control signal PDC and the pull-up control signal have a logic high level. In the initial section where the previous state is not defined, the pull-down signal DNB and the pull-up signal UPB may have an undefined state. The dynamic logic unit 140 may drive the pull-down signal DNB to a logic high level and drive the pull-up signal UPB to a logic low level when the pull-down control signal PDC is at a logic high level and the pull-up control signal is at a logic low level. The dynamic logic unit 140 may drive the pull-down signal DNB to a logic high level and drive the pull-up signal UPB to a logic low level when the pull-down control signal PDC is at a logic low level and the pull-up control signal is at a logic high level.

The output driver 160 may output a serial data DOUT of a logic high level when the pull-up signal UPB is at a logic low level. The output driver 160 may output a serial data DOUT of a logic low level when the pull-down signal DNB is at a logic low level.

Figure 7:
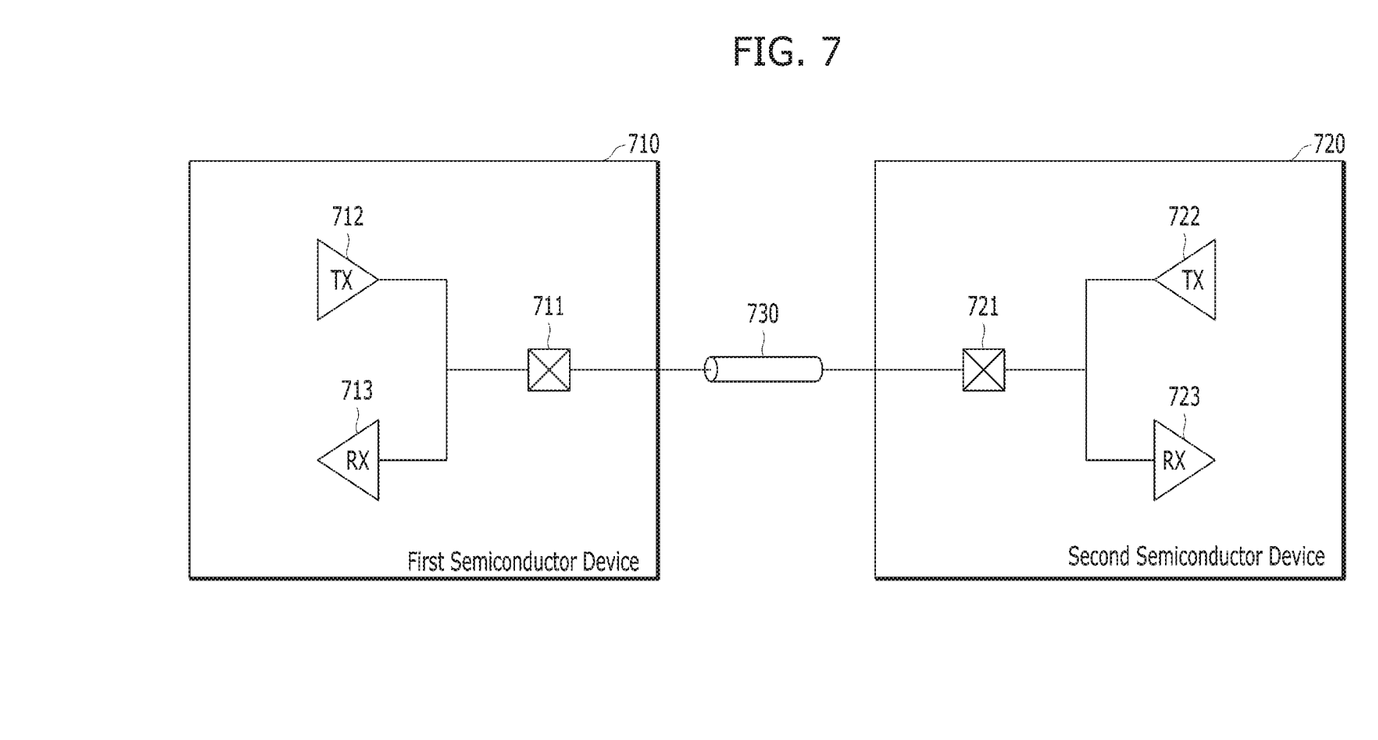
FIG. 7 is a block diagram illustrating a structure of a semiconductor system in accordance with another embodiment of the invention.

FIG. 7 is a block diagram illustrating a structure of a semiconductor system 700 in accordance with another embodiment of the invention.

Referring to FIG. 7, the semiconductor system 700 may include a first semiconductor device 710 and a second semiconductor device 720. The first semiconductor device 710 and the second semiconductor device 720 may be electronic components that communicate with each other. In accordance with one embodiment of the invention, the first semiconductor device 710 may be a master device and the second semiconductor device 720 may be a slave device which is controlled by the first semiconductor device 710. For example, the first semiconductor device 710 may be a host device such as a processor, and the processor may be a Central Processing Unit (CPU), a Graphic Processing Unit (GPU), a Multi-Media Processor (MMP), and a Digital Signal Processor (DSP). Also, it may be realized in the form of a System On Chip (SOC) by combining processor chips having diverse functions, such as an Application Processor (AP). The second semiconductor device 720 may be a memory, and the memory may include a volatile memory and a non-volatile memory. The volatile memory may include a Static Random-Access Memory (SRAM), a Dynamic Random-Access Memory (DRAM), a Synchronous DRAM (SDRAM) and the like. The non-volatile memory may include a Read Only Memory (ROM), a Programmable Read Only Memory (PROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

The first and second semiconductor devices 710, 720 may be coupled to each other through a signal transfer line 730. The first semiconductor device 710 may include a pad 711 and the pad 711 may be coupled to the signal transfer line 730. The second semiconductor device 720 may include a pad 721 and the pad 721 may be coupled to the signal transfer line 730. The signal transfer line 730 may be a channel, a link, or a bus.

The first semiconductor device 710 may include a transfer circuit TX 712 and a receiving circuit RX 713. The transfer circuit 712 may generate an output signal based on an internal signal of the first semiconductor device 710 and may transfer the output signal to the second semiconductor device 720 through the signal transfer line 730. The receiving circuit 713 may receive the signal transferred from the second semiconductor device 720 through the signal transfer line 730 to generate the internal signal.

Similarly, the second semiconductor device 720 may include a transfer circuit TX 722 and a receiving circuit RX 723. The transfer circuit 722 may generate an output signal based on an internal signal of the second semiconductor device 720 and may transfer the output signal to the first semiconductor device 710 through the signal transfer line 730. The receiving circuit 723 may receive the signal transferred from the first semiconductor device 710 through the signal transfer line 730 to generate the internal signal.

The signal transfer line 730 may be a data bus, and the signal transferred through the signal transfer line 730 may be data. The transfer circuit 712 of the first semiconductor device 710 may transfer the internal data of the first semiconductor device 710 to the second semiconductor device 720. The receiving circuit 713 may receive the data from the second semiconductor device 720 from the second semiconductor device 720. The transfer circuit 722 of the second semiconductor device 720 may transfer the internal data of the second semiconductor device 720 to the first semiconductor device 710 and the receiving circuit 723 may receive the data from the first semiconductor device 710. The first and second semiconductor devices 710, 720 may perform a serial communication. Serial data may be transmitted via the signal transfer line 730. The first and second semiconductor devices 710, 720 may convert the serial data into parallel internal data in order to quickly process the large capacity data. The receiving circuits 713, 723 may include a parallelizer (not shown) for receiving serial data and converting the serial data into parallel data. The transfer circuits 712, 722 may include a serializer (not shown) for converting the parallel internal data into serial data. The serializer 100 in accordance with the embodiment of the present invention shown in FIG. 3 may be applied as a serializer of the transfer circuits 712, 722.

According to the embodiment of the invention, the semiconductor system including the hybrid-type serializer may improve an operation reliability while performing a high-speed operation.

While the invention has been described with respect to the specific embodiments, it will be apparent to those skilled in the art that various changes and modifications may be made without departing from the spirit and scope of the invention as defined in the following claims.

For example, a logic gate and a transistor exemplarily described in the embodiments of the invention described above may be realized to have different positions and kinds according to the polarity of an inputted signal.

What is claimed is:

1. A serializer, comprising:
    a data trigger circuit suitable for latching a plurality of input data based on a plurality of clocks having a predetermined phase difference to output a plurality of aligned data and a plurality of complementary aligned data;
    a hybrid multiplexing circuit suitable for outputting a pull-down signal and a pull-up signal that are selectively controlled based on a pull-down control signal which is generated by removing an input loading of the aligned data and a pull-up control signal which is generated by removing an input loading of the complementary aligned data; and
    an output driver suitable for outputting serial data corresponding to the pull-up signal and the pull-down signal.

2. The serializer of claim 1, wherein the hybrid multiplexing circuit includes:
    a static logic unit suitable for generating the pull-down control signal by removing the input loading of the aligned data, and generating the pull-up control signal by removing the input loading of the complementary aligned data; and
    a dynamic logic unit suitable for outputting the pull-down signal and the pull-up signal that are selectively driven based on the pull-down control signal and the pull-up control signal.

3. The serializer of claim 2, wherein when all the aligned data come to be at a first logic level, the static logic unit outputs the pull-down control signal at a first logic level, and when all the complementary aligned data come to be at the first logic level, the static logic unit outputs the pull-up control signal at the first logic level.

4. The serializer of claim 2, wherein the static logic unit includes:
    a plurality of first logic gates suitable for performing a logic NAND operation onto two adjacent data among the aligned data;
    a second logic gate suitable for outputting the pull-down control signal by performing a logic NOR operation onto outputs of the first logic gates;
    a plurality of third logic gates suitable for performing a logic NAND operation onto two adjacent data among the complementary aligned data; and
    a fourth logic gate suitable for outputting the pull-up control signal by performing a logic NOR operation onto outputs of the third logic gates.

5. The serializer of claim 2, wherein the dynamic logic unit includes:
    a first drive controller suitable for driving a first output signal based on the pull-down control signal and the pull-up control signal;
    a first latch suitable for outputting the pull-down signal by inverting and latching the first output signal;
    a second drive controller suitable for driving a second output signal based on the pull-down control signal and the pull-up control signal; and
    a second latch suitable for outputting the pull-up signal by inverting and latching the second output signal.

6. The serializer of claim 5, wherein the first drive controller includes:
    a first pull-up transistor that is coupled between a power source voltage terminal and a first output node that outputs the first output signal, and receives the pull-down control signal through a gate; and
    a first pull-down transistor that is coupled between a ground voltage terminal and the first output node, and receives an inverted signal of the pull-up control signal through a gate.

7. The serializer of claim 5, wherein the second drive controller includes:
    a second pull-up transistor that is coupled between a power source voltage terminal and a second output node that outputs the second output signal, and receives the pull-up control signal through a gate; and
    a second pull-down transistor that is coupled between a ground voltage terminal and the second output node, and receives an inverted signal of the pull-down control signal through a gate.

8. The serializer of claim 1, wherein the clocks have a phase difference which is obtained by dividing 360 degrees (°) by the number of input data, and the data trigger circuit differentially amplifies the input data based on adjacent clocks among the clocks, and outputs the aligned data and the complementary aligned data.

9. The serializer of claim 8, wherein the data trigger circuit differentially amplifies the input data and outputs the aligned data and the complementary aligned data in a first section in which the adjacent clocks have a predetermined logic level, and the data trigger circuit pre-charges the aligned data and the complementary aligned data at the predetermined logic level in a second section which is not the first section.

10. The serializer of claim 1, wherein the data trigger circuit includes a plurality of trigger units corresponding to the input data, and each of the trigger units includes:
an initializer suitable for initializing a first node which outputs the aligned data and a second node which outputs the complementary aligned data in response to a first clock and a second clock;
a charge discharger suitable for receiving the input data and discharging charges from the first node and the second node in response to the first clock and the second clock; and
a charge supplier suitable for selectively supplying charges to the first node and the second node based on logic levels of the first node and the second node.

11. The serializer of claim 10, wherein the charge discharger selectively discharges the changes from the first node and the second node based on the logic level of the corresponding input data in a section where the first clock and the second clock are at predetermined logic levels.

12. A semiconductor system, comprising:
a first semiconductor device; and
a second semiconductor device suitable for serially communicating with the first semiconductor device through a transfer line,
wherein each of the first semiconductor device and the second semiconductor device includes the transfer line for converting parallel internal data into a serial data, and
the transfer line includes:
a data trigger circuit suitable for latching an internal data based on a plurality of clocks having a predetermined phase difference to output a plurality of aligned data and a plurality of complementary aligned data;
a hybrid multiplexing circuit suitable for outputting a pull-down signal and a pull-up signal that are selectively driven based on a pull-down control signal which is generated by removing an input loading of the aligned data and a pull-up control signal which is generated by removing an input loading of the complementary aligned data; and
an output driver suitable for outputting the serial data corresponding to the pull-up signal and the pull-down signal.

13. The semiconductor system of claim 12, wherein the hybrid multiplexing circuit includes:
a static logic unit suitable for generating the pull-down control signal by removing the input loading of the aligned data, and generating the pull-up control signal by removing the input loading of the complementary aligned data; and
a dynamic logic unit suitable for outputting the pull-down signal and the pull-up signal that are selectively driven based on the pull-down control signal and the pull-up control signal.

14. The semiconductor system of claim 13, wherein the static logic unit includes:
a plurality of first logic gates suitable for performing a logic NAND operation onto two adjacent data among the aligned data;
a second logic gate suitable for outputting the pull-down control signal by performing a logic NOR operation onto outputs of the first logic gates;
a plurality of third logic gates suitable for performing a logic NAND operation onto two adjacent data among the complementary aligned data; and
a fourth logic gate suitable for outputting the pull-up control signal by performing a logic NOR operation onto outputs of the third logic gates.

15. The semiconductor system of claim 13, wherein the dynamic logic unit includes:
a first drive controller suitable for driving a first output signal based on the pull-down control signal and the pull-up control signal;
a first latch suitable for outputting the pull-down signal by inverting and latching the first output signal;
a second drive controller suitable for driving a second output signal based on the pull-down control signal and the pull-up control signal; and
a second latch suitable for outputting the pull-up signal by inverting and latching the second output signal.

16. The semiconductor system of claim 15, wherein the first drive controller includes:
a first pull-up transistor that is coupled between a power source voltage terminal and a first output node that outputs the first output signal, and receives the pull-down control signal through a gate; and
a first pull-down transistor that is coupled between a ground voltage terminal and the first output node, and receives an inverted signal of the pull-up control signal through a gate.

17. The semiconductor system of claim 15, wherein the second drive controller includes:
a second pull-up transistor that is coupled between a power source voltage terminal and a second output node that outputs the second output signal, and receives the pull-up control signal through a gate; and
a second pull-down transistor that is coupled between a ground voltage terminal and the second output node, and receives an inverted signal of the pull-down control signal through a gate.

18. The semiconductor system of claim 12, wherein the clocks have a phase difference which is obtained by dividing 360 degrees(°) by the number of internal data, and
the data trigger circuit differentially amplifies the internal data based on adjacent clocks among the clocks, and outputs the aligned data and the complementary aligned data.

19. The semiconductor system of claim 18, wherein the data trigger circuit differentially amplifies the internal data and outputs the aligned data and the complementary aligned data in a first section in which the adjacent clocks have a predetermined logic level, and
the data trigger circuit pre-charges the aligned data and the complementary aligned data at the predetermined logic level in a second section which is not the first section.

20. The semiconductor system of claim 19, wherein the data trigger circuit includes a plurality of trigger units corresponding to the internal data, and
each of the trigger units includes:
  an initializer suitable for initializing a first node which outputs the aligned data and a second node which outputs the complementary aligned data in response to a first clock and a second clock;
  a charge discharger suitable for receiving the internal data and discharging charges from the first node and the second node in response to the first clock and the second clock; and
  a charge supplier suitable for selectively supplying charges to the first node and the second node based on logic levels of the first node and the second node.

* * * * *